Nov. 13, 1962 G. STRULL 3,064,132

SEMICONDUCTOR DEVICE

Filed Nov. 10, 1959 2 Sheets-Sheet 1

WITNESSES

John C. Healy, Jr.

Charles L. Menzemer

INVENTOR

Gene Strull

BY

Frederick Shapoe

ATTORNEY

SEMICONDUCTOR DEVICE

Filed Nov. 10, 1959 2 Sheets-Sheet 2

United States Patent Office 3,064,132
Patented Nov. 13, 1962

3,064,132

SEMICONDUCTOR DEVICE

Gene Strull, Pikesville, Md., assignor to Westinghouse Electric Corporation, East Pittsburgh, Pa., a corporation of Pennsylvania Filed Nov. 10, 1959, Ser. No. 852,116
5 Claims. (Cl. 250—211)

This invention relates generally to a semiconductor device, and more specifically to a light sensitive optically tunable semiconductor device.

An object of the present invention is to provide a semiconductor device suitable for telemetering purposes which is light sensitive and responsive to a changing illumination level to produce a variation in electrical frequency output.

Another object of the present invention is to provide an optically tunable semiconductor device suitable for use in a relaxation oscillator circuit.

Other objects of the present invention will, in part, appear hereinafter and will, in part, be obvious.

For a better understanding of the nature and objects of the invention, reference should be had to the following detailed description and drawings, in which:

FIGURE 1 is a side view, in cross section, of a wafer of semiconductor material;

FIGS. 2 through 4 inclusive are side views, in cross section, of the wafer of FIG. 1 undergoing various treatments in accordance with the teachings of this invention;

In accordance with the present invention and attainment of the foregoing objects, there is provided a light sensitive, optically tunable, semiconductor device comprising a body of a semiconductor material having a first type of semiconductivity, a thin layer of a second type of semiconductivity completely surrounding said body with the exception of an open surface area, a small amount of said open surface area having a layer of a second type of semiconductivity disposed thereon, and said layer of second type semiconductivity having disposed thereon a layer of said first type semiconductivity, the remainder of the open surface area of the body being exposed to receive radiation thereon.

For the purpose of simplicity and clarity, the teachings of the invention will be set forth in terms of a silicon n-p-n-p semiconductor device. It will be understood, however, that the teachings of this invention are applicable as well to devices of any semiconductor material and particularly those comprised of germanium and stoichiometric compounds of elements of group III and group V of the periodic table, for example, indium arsenide, indium antimonide, gallium arsenide, and gallium antimonide of either n-p-n-p or p-n-p-n configuration.

Figure 1:
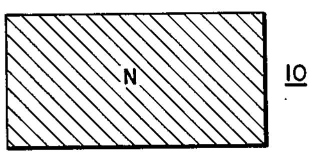

With reference to FIG. 1, there is illustrated a single crystal silicon wafer 10 of n-type semiconductivity. The doped wafer 10 may be prepared by any of the methods known to those skilled in the art. For example, a single-crystal silicon rod may be pulled from a melt comprised of silicon and at least one element from group V of the periodic table, for example, arsenic, antimony or phosphorus. The wafer 10 is then cut from the rod with, for example, a diamond saw. The surfaces of the wafer may then be lapped or etched or both to produce a smooth surface after sawing. The thickness is not critical.

The wafer 10 is then disposed in a diffusion furnace. The hottest zone of the furnace is at a temperature within the range of 1100° C. to 1200° C. and has an atmosphere of the vapor of an acceptor doping material, for example, indium, gallium, aluminum or boron. The zone of the furnace in which a crucible of said acceptor impurity lies may be at a temperature of from 600° C. to 1200° C., the specific temperature being selected to ensure the desired vapor pressure and surface concentration of diffusant from the crucible. The acceptor impurity diffuses into the surface of the n-type silicon wafer.

Figure 2:
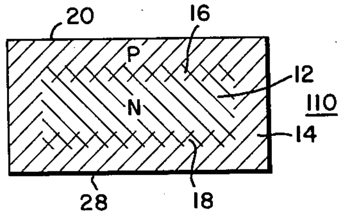

With reference to FIG. 2, there is illustrated a wafer 110 which is the n-type wafer of FIG. 1 after diffusion of the doping impurity to a selected depth through all surfaces of the wafer. The wafer 110 is comprised of a central n-type region 12, surrounded by a thin p-type surface layer 14. There is a p-n junction 16 between the top surface of region 12 and layer 14, and a p-n junction 18 between the bottom surface of region 12 and layer 14. The wafer comprises a top surface 20 and a bottom surface 28.

Layer 14 must be deep enough to permit diffusion of additional layer impurities therein without penetration through the layer 14 to the n-type region 12. The layer 14 should not be so deep, however, as to substantially increase the forward voltage drop of the finished semiconductor device. A depth or thickness of from 0.75 mil to 2.5 mils, preferably about 1 mil, for the layer 14 has been found satisfactory for the device of this invention.

Figure 3:
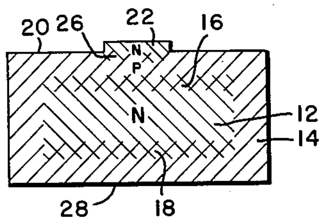

Referring to FIG. 3, a layer 22 of n-type semiconductivity is then formed by disposing a donor doping material or alloy, preferably in the form of a foil or pellet having a thickness of about 0.75 mil to 2 mils, upon the top surface 20 of thin layer 14 and fusing the foil or pellet to the p-type region by heating in a vacuum or inert atmosphere, for example, an argon or helium atmosphere at a temperature of from 650° C. to 750° C. Care must be taken that layer 22 does not penetrate through layer 14 to region 12.

Examples of suitable doping materials or alloys of which the layer 22 may be comprised include arsenic, antimony, and alloys thereof such for instance as alloys of gold and antimony or arsenic. For instance, a foil of an alloy comprising 99.5%, by weight, gold and 0.5%, by weight, antimony is suitable.

A p-n- junction 26 is formed between layer 14 and layer 22 following the fusion of the layer 22 to surface 20 of p-type layer 14. The layer 22 has a top surface 32.

Layer 22 may also be formed by suitably masking a predetermined area of surface 20 of layer 14 and introducing a suitable doping material onto the unmasked area by vapor diffusion thereat.

Figure 4:
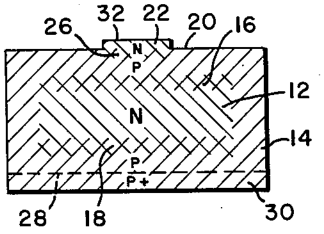

With reference to FIG. 4, a p(+)-type semi-conductive layer 30 is joined to the bottom surface 28 of the p-type layer 14. The layer 30 is of a higher concentration of p-type semiconductivity doping material than is layer 14. The layer 30 may be comprised in part of at least one element from group III of the periodic table, for example, boron, aluminum, gallium and indium, the remainder, if any, being a neutral metal or silicon. The layer 30 may also be comprised of an alloy, for example, an aluminum-silicon alloy, a gold-bismuth-boron alloy, a gold-boron alloy, for example, an alloy comprised of 99% by weight gold and 1% by weight boron, a gold-gallium alloy, silver-tin-indium alloy or a silver-indium alloy such as a 90%, by weight, silver—10%, by weight, indium alloy. The layer 30, which may be in the form of a pellet, foil or the like is disposed upon surface 28 of layer 14 and fused thereto by heating in a vacuum or inert atmosphere, for example, a vacuum having an absolute pressure of from $10^{-2}$ to $10^{-5}$ millimeters Hg, or for example, an argon or helium atmosphere. Layer 30 may also be formed by the vapor diffusion process or technique wherein vapors of aluminum are coated on surface 28 and then diffused part way therein.

Figure 5:
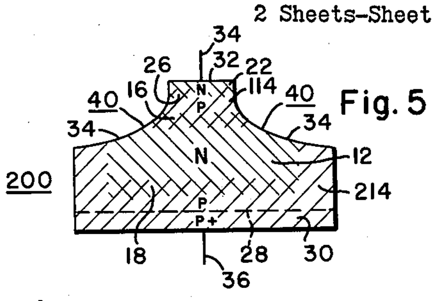
FIG. 5 is a side view, in cross section, of a semiconductor device prepared in accordance with the teachings of this invention.

The top surface 32 of the n-type layer 22 is suitably masked and the surface 20 of thin layer 14 up to layer 22 is etched away. The etching is carried on until region 12 is fully exposed and region 14 is separated into a top portion 114 and bottom portion 214 to produce the structure as illustrated in FIG. 5. Thereby electrical current flows from layer 22 to layer 14 through the p-n junction 26.

In FIG. 5, the amount of material removed by etching has been exaggerated for purposes of clarity, and the device configuration of FIG. 5 is suitable for use, but it is not necessary to remove as much of layer 14 as is illustrated. Thus only a channel surrounding layer 22 need be etched through layer 14 to expose region 12. That portion of layer 14 disposed between the bottom of layer 22 and the top surface of region 12 is not affected by the etching process.

The etchant employed may be any suitable reagent known to those skilled in the art for etching silicon, for example, a mixture of nitric acid, hydrofluoric acid and acetic acid (CP4).

Electrical leads or contacts 34 and 36 are joined to layers 22 and 30, respectively, by soldering, brazing or the like. The contacts or leads 34 and 36 may be comprised of any suitable electrical conducting material such as copper aluminum, silver and the like, and may be any suitable shape or form.

The semiconductor device illustrated in FIG. 5 is a light sensitive, optically tunable semiconductor device which is suitable for use in a relaxation oscillator circuit.

Certain characteristics of the semiconductor device of this invention are set forth graphically and described hereinafter. It is to be understood that these characteristics will vary somewhat depending on the semiconductor material employed and the area exposed and thickness of the wafer. The characteristics set forth graphically in FIG. 6 and FIGS. 8 to 12, inclusive, are for a silicon device fabricated from a wafer having an original thickness of about 5 mils, a total diameter of ⅜ inch, in which layer 14 was formed with a thickness of 1 mil, and layer 22 was about 100 mils in diameter.

Figure 6:
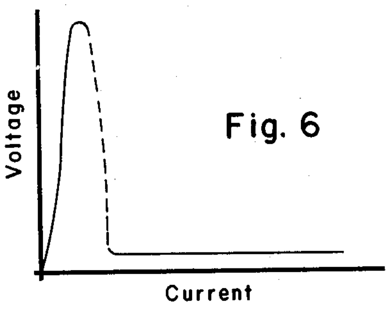
FIG. 6 is a graphical presentation of the I—V characteristics of the device of this invention.

With reference to FIG. 6, there is illustrated the first quadrant I—V characteristics of the light sensitive optically tunable silicon semiconductor device of this invention.

From the diagram of FIG. 6, it can be seen that the device, in the absence of light, can withstand a considerable increase in voltage with a relatively small increase in current until a certain break-over point is reached, as indicated by the peak of the initial steep curve, and when the break-over point is exceeded the voltage will drop sharply and the current will increase while the voltage remains substantially constant or increases quite slowly.

Figure 7:
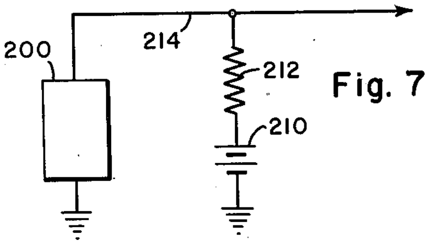
FIG. 7 is a schematic drawing of an electrical circuit employing the semiconductor device of this invention.

With reference to FIG. 7, there is illustrated one possible telemetering circuit employing the light sensitive optically tunable semiconductor device of this invention. The circuit is comprised of the light sensitive optically tunable semiconductor device 200 illustrated in FIG. 5, a power source 210 and a load 212. The device 200, the power source 210 and load 212 are connected by a conductor 214 and through ground.

Figure 8:
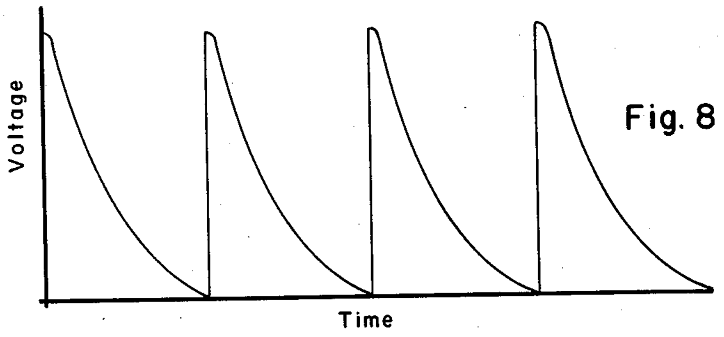
FIG. 8 is a graphical presentation of the wave form of voltage plotted against time obtained in the practice of this invention with a silicon semiconductor device.
Figure 9:
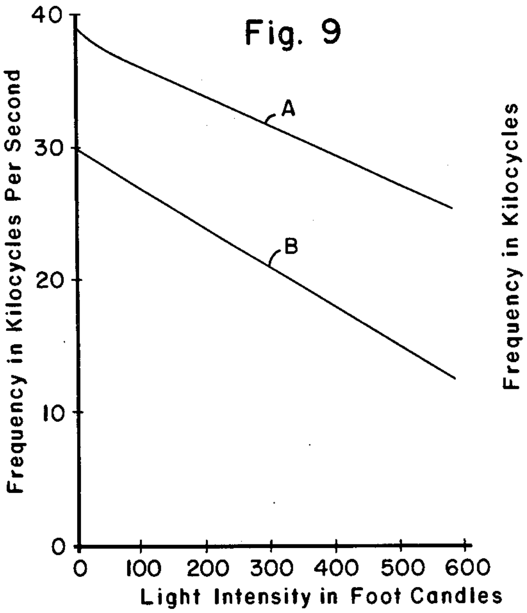
FIG. 9 is a graphical presentation of the relationship between frequency and light intensity of two silicon semiconductor devices produced in accordance with this invention.

When the telemetering system of FIG. 7 is connected in this manner, a sawtooth oscillation is generated in darkness, and for certain light intensities, (for proper range of voltage from the power supply). The sawtooth oscillation of the voltage output is illustrated in FIG. 8. The minimum voltage at the base of each wave is of a small value depending on the power supply. When certain radiation, and particularly visible light, is incident on the surface 40 generally and on p-n junction 26, specifically, of the semiconductor device, the frequency of oscillation decreases until for a sufficiently intense light the system goes out of oscillation a relatively straight line voltage output is obtained.

When the structure is made from silicon, visible light over the entire spectrum from ultra-violet through infrared will act on the system, but it is most strongly influenced by light in the red region. Thus the device of this invention provides a varying frequency signal for different values of light intensity of a constant wave length. The variation in frequency versus light intensity derived from an incandescent tungsten lamp is illustrated graphically in FIG. 9 for two different silicon units A and B. The characteristics of the device of this invention are in marked contrast to other semiconductor structures used for light sensing, wherein only a change in resistance, or in direct-current voltage level, is caused by changing levels of illumination.

Figure 10:
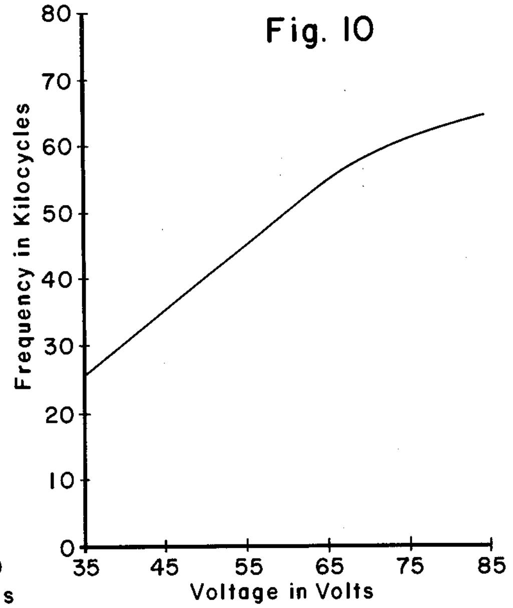
FIG. 10 is a graphical presentation of the relationship between frequency and voltage of a silicon semiconductor device of this invention.

Another characteristic of the light sensitive optically tunable semiconductor device of this invention when used in the relaxation oscillation circuit of FIG. 7 is illustrated in FIG. 10. The curve shows graphically the relationship between dark frequency and input voltage for the device from which FIG. 8 was made. The characteristics illustrated in FIG. 10 were determined at room temperature, 25° C.

Figure 11:
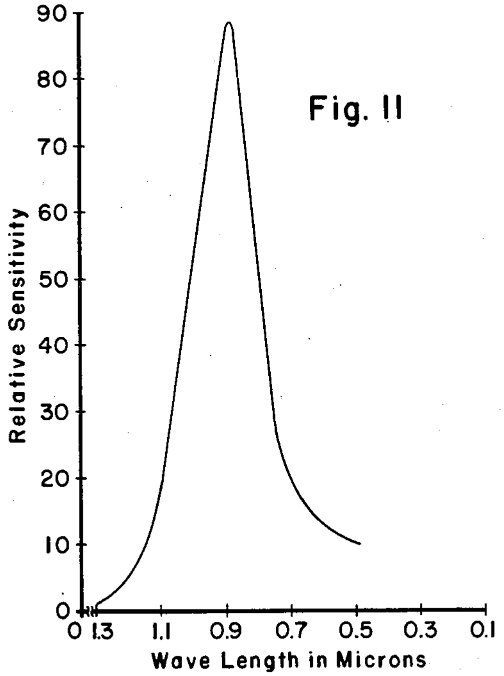
FIG. 11 is a graphical presentation of the spectral response of a silicon semiconductor device of this invention at constant voltage and temperature.

The spectral response of the telemetering system illustrated in FIG. 7 is set forth graphically in FIG. 11. From FIG. 11 it can be seen that at a constant voltage and temperature, the device is most sensitive in the red region. It decreases most rapidly from its peak sensitivity to zero value as the spectrum progresses toward the infrared and not quite as rapidly to the blue region. However, the device can be modified so that its sensitivity can be correlated to any region of the spectrum.

Figure 12:
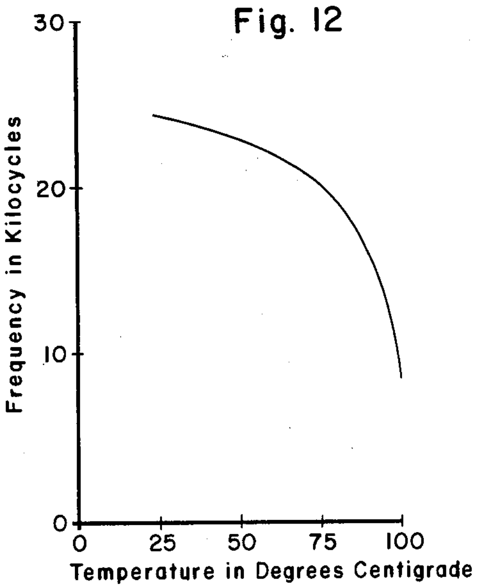
FIG. 12 is a graphical presentation of the relationship between frequency and temperature of a silicon semiconductor device of this invention.

With reference to FIG. 12, there is illustrated graphically the variation of dark frequency of oscillation with temperature. While the semiconductor device of this invention will oscillate at temperatures well over 100° C., the frequency begins to drop sharply as a temperature of about 75° C. is exceeded. For many light sensing applications the telemetering system may be used up to 55° C. with reasonably reliable results. However, where greater accuracy is desired, a constant temperature of environment should be provided for the device.

The device and telemetering system incorporating this device may be used, among other things, for space and satellite light telemetry, optical alarm systems, and as a free running multivibrator. A very intense light sends the telemetering system, including the semiconductor device of this invention, out of oscillation. The interruption of this light will put the circuit back into oscillation. There are many applications for a device having such a mode of operation. If an audible note is desired for use as an alarm system, it can be of a normally open or normally closed type. For example, an intense light may keep the system out of oscillation. The interruption of this beam could put the structure into oscillation in the audio range giving an audible sound. On the other hand, it is possible to make a structure oscillate at a frequency above audio. Upon impinging a light beam on the structure of the semiconductor device, the frequency will drop into the audio range giving an audible note.

The semiconductor device of this invention is a new and novel solid state structure which functions in a light telemeter system. The semiconductor device of this invention functioning as an optically tuned relaxation oscillator makes it possible in a single structure to provide for the translation of a changing light level into varying frequency. Further, this phenomenon is provided directly within the body of semiconductor material by modification of the internal structure.

The following example is illustrative of the practice of this invention.

*Example I*

A flat circular wafer of n-type silicon having a resistivity of 50 ohm-cm., and of ⅜ inch in diameter and a thickness of 5 mils, was disposed in a diffusion furnace. The diffusion furnace was at a maximum temperature of 1200° C. and had a gallium vapor atmosphere. The gallium was allowed to diffuse into the wafer to a depth of 1 mil. The wafer was then removed from the diffusion furnace. The structure is that illustrated in FIG. 2.

Thereafter, an n-type doping pellet having a diameter of ¼ inch and comprised of 99.5%, by weight, gold and 0.5%, by weight, antimony was disposed upon the top surface of the gallium diffused wafer and fused to the n-type gallium layer. Care was exercised to ensure that the pellet did not fuse completely through the gallium layer. The structure is that illustrated in FIG. 3.

A p(+)-type layer is formed on the bottom surface of the structure by alloying an aluminum-silicon alloy comprised of 98%, by weight, silicon and 2%, by weight, aluminum to the bottom surface of the structure. The fusion is carried out at a temperature of 725° C. The structure at this stage is illustrated in FIG. 4.

Then, the upper surface of the n-type layer, formed by fusing the gold-antimony pellet to the gallium layer, is masked with an organic wax and the upper surface of the structure was etched with an etchant comprised of nitric acid, hydrofluoric acid and acetic acid (CP4). The etching removes all of the gallium diffused layer on the upper surface, except that disposed directly below the gold-antimony n-type layer.

Electrical contacts of silver were then joined to the n-type gold-antimony layer and to the p(+) aluminum-silicon layer. The structure is that illustrated in FIG. 5.

The structure or device thus prepared is a light sensitive, optically tunable semiconductor suitable for use in accordance with the teachings of this invention.

Similarly, devices from germanium and indium arsenide and indium antimonide, were processed as in this Example I with equally satisfactory results.

It will be understood that the above description and drawings are illustrative and not limiting.

I claim as my invention:

1. A light sensitive optically tunable two terminal semiconductor device consisting essentially of a body of a semiconductor material having a first type of semiconductivity, a thin layer of a second type of semiconductivity present on said body and forming a p-n junction therewith, a surface area of the body being open, a portion of said open surface area having a layer of said second type of semiconductivity disposed thereon, and the said last-mentioned layer of second type of semiconductivity having disposed thereon a superimposed layer of said first type semiconductivity to provide a p-n junction therebetween, and a first electrical contact affixed to said thin layer and a second electrical contact affixed to said superimposed layer, the p-n junction at the superimposed layer being exposed to receive radiation thereon.

2. A light sensitive optically tunable two terminal semiconductor device suitable for use in a relaxation oscillator circuit comprising a first region of a first type of semiconductivity, said first region having a top surface, a bottom surface and side surfaces, a thin layer of a second type of semiconductivity disposed about and contiguous with the side surfaces and bottom surfaces of the first region, a first p-n junction being present between the bottom surface of said first region and said inner bottom surface of said thin layer of the second type of semiconductivity, another thin layer having the second type of semiconductivity with its bottom surface being disposed upon and contiguous with the top surface of said first region and providing a p-n junction therewith, said another thin layer being of lesser cross-sectional area than the top surface of said first region so that at least the surrounding portion of the top surface of said first region is exposed, a third layer having the first type of semiconductivity having its bottom surface disposed upon, contiguous and coextensive with the top surface of said another thin layer to provide a third p-n junction therebetween, a bottom layer of relatively highly concentrated second type semiconductivity doping material joined to the outer bottom surface of said first mentioned thin layer of second type semiconductivity, a first electrical contact affixed to said bottom layer, and a second electrical contact affixed to the top surface of said third layer of first type semiconductivity, the exposed p-n junction between the third layer and the said another thin layer being adapted to receive radiation.

3. A light sensitive optically tunable semiconductor device fabricated from a material selected from the group consisting of silicon, germanium and stoichiometric compounds of group III and group V of the periodic table comprising a first region of a first type of semiconductivity, said first region having a top surface, a bottom surface and side surfaces, a thin layer of second type semiconductivity disposed about and contiguous with the side surfaces and bottom surfaces of the first region, a first p-n junction being present between the bottom surface of said first region and said inner bottom surface of said thin layer of the second type of semiconductivity, another thin layer having the second type of semiconductivity with its bottom surface being disposed upon and contiguous with the top surface of said first region and providing a p-n junction therewith, said another thin layer being of lesser cross-sectional area than the top surface of said first region so that at least the surrounding portion of the top surface of said first region is exposed, a third layer having the first type of semiconductivity having its bottom surface disposed upon, contiguous and coextensive with the top surface of said another thin layer to provide a third p-n junction therebetween, a bottom layer of relatively highly concentrated second type semiconductivity doping material joined to the outer bottom surface of said first mentioned thin layer of second type semiconductivity, a first electrical contact affixed to said bottom layer, and a second electrical contact affixed to the top surface of said third layer of first type semiconductivity, the exposed p-n junction between the third layer and the said another thin layer being adapted to receive radiation.

4. A light sensitive optically tunable silicon semiconductor device comprising a first region of a first type of semiconductivity, said first region having a top surface, a bottom surface and side surfaces, a thin layer of second type of semiconductivity disposed about and contiguous with the side surfaces and bottom surfaces of the first region, a first p-n junction being present between the bottom surface of said first region and said inner bottom surface of said thin layer of the second type of semiconductivity, another thin layer having the second type of semiconductivity with its bottom surface being disposed upon and contiguous with the top surface of said first region and providing a p-n junction therewith, said another thin layer being of lesser cross-sectional area than the top surface of said first region so that at least the surrounding portion of the top surface of said first region is exposed, a third layer having the first type of semiconductivity having its bottom surface disposed upon, contiguous and coextensive with the top surface of said another thin layer to provide a third p-n junction therebetween, a bottom layer of relatively highly concentrated second type semiconductivity doping material joined to the outer bottom surface of said first mentioned thin layer of second type semiconductivity, a first electrical contact affixed to said bottom layer, and a second electrical contact affixed to the top surface of said third layer of first type semiconductivity, the exposed p-n junction between the third layer and the said another thin layer being adapted to receive radiation.

5. A light telemetering system comprising a light sensitive optically tunable two terminal semiconductor device comprising a body of a semiconductor material having a first type of semiconductivity, a thin layer of a second type of semiconductivity present on said body and forming a p-n junction therewith, a surface area of the body being open, a portion of said open surface area having a layer of said second type of semiconductivity disposed thereon, and the said last mentioned layer of second type of semiconductivity having disposed thereon a superimposed layer of said first type semiconductivity to provide a p-n junction therebetween, the p-n junction at the superimposed layer being exposed to receive radiation thereon, said light sensitive optically tunable semiconductor device being connected in a series circuit relationship with an electric power source and a load by a first electrical contact affixed to said superimposed layer, and by a second electrical contact affixed to said thin layer of second type of semiconductivity.

References Cited in the file of this patent

UNITED STATES PATENTS

| | | |
|---|---|---|
| 2,779,877 | Lehovec | Jan. 29, 1957 |
| 2,790,088 | Shive | Apr. 23, 1957 |
| 2,846,592 | Rutz | Aug. 5, 1958 |
| 2,914,665 | Linder | Nov. 24, 1958 |